US010612142B2

(12) United States Patent
Ooshima et al.

(10) Patent No.: US 10,612,142 B2
(45) Date of Patent: Apr. 7, 2020

(54) APPARATUS FOR FORMING THIN FILM

(71) Applicant: KIRIN BEER KABUSHIKI KAISHA, Nakano-ku (JP)

(72) Inventors: Hiroyuki Ooshima, Kawasaki (JP); Keiichi Fujimoto, Kawasaki (JP); Hiroyasu Tabuchi, Nakano-ku (JP); Masaki Nakaya, Nakano-ku (JP)

(73) Assignee: KIRIN BEER KABUSHIKI KAISHA, Nakano-ku (JP)

( * ) Notice: Subject to any disclaimer, the term of this patent is extended or adjusted under 35 U.S.C. 154(b) by 608 days.

(21) Appl. No.: 14/368,161

(22) PCT Filed: Dec. 26, 2012

(86) PCT No.: PCT/JP2012/083679
§ 371 (c)(1),
(2) Date: Jun. 23, 2014

(87) PCT Pub. No.: WO2013/099960
PCT Pub. Date: Jul. 4, 2013

(65) Prior Publication Data
US 2014/0366806 A1 Dec. 18, 2014

(30) Foreign Application Priority Data
Dec. 27, 2011 (JP) ................. 2011-284609

(51) Int. Cl.
*C23C 16/46* (2006.01)
*C23C 16/04* (2006.01)
(Continued)

(52) U.S. Cl.
CPC .............. *C23C 16/46* (2013.01); *B65D 23/02* (2013.01); *C23C 16/045* (2013.01); *C23C 16/27* (2013.01);
(Continued)

(58) Field of Classification Search
CPC ....... B65D 23/02; C23C 16/045; C23C 16/27; C23C 16/345; C23C 16/401;
(Continued)

(56) References Cited

U.S. PATENT DOCUMENTS 3,804,059 A * 4/1974 Streel .................... C23C 14/046
118/726
5,374,314 A * 12/1994 Babacz ................. C23C 16/045
118/723 E
(Continued)

FOREIGN PATENT DOCUMENTS

JP         8 508964      9/1996
JP     2004 107781      4/2004
(Continued)

OTHER PUBLICATIONS

JP2007-105999 English Machine Translation.*
(Continued)

*Primary Examiner* — Rakesh K Dhingra
*Assistant Examiner* — Laureen Chan
(74) *Attorney, Agent, or Firm* — Oblon, McClelland, Maier & Neustadt, L.L.P.

(57) ABSTRACT

A film formation apparatus for forming a thin film having high gas barrier performance, such as a DLC (Diamond Like Carbon) film, a SiOx film, a SiOC film, a SiOCN film, a SiNx film, and an AlOx film, on an inner surface and/or an outer surface of a container such as a PET bottle. The film formation apparatus has: a vacuum chamber for forming, in a vacuum state, a film on a surface of a container using a heat generating element; a vacuum evacuation device for vacuumizing the vacuum chamber; and a relative shifting device for relatively shifting the container and the heat generating element in the vacuum chamber after the vacuumization of the vacuum chamber.

13 Claims, 6 Drawing Sheets

(51) Int. Cl.
   *C23C 16/54*   (2006.01)
   *C23C 16/448*  (2006.01)
   *C23C 16/27*   (2006.01)
   *C23C 16/34*   (2006.01)
   *C23C 16/40*   (2006.01)
   *C23C 16/455*  (2006.01)
   *B65D 23/02*   (2006.01)

(52) U.S. Cl.
   CPC .......... *C23C 16/345* (2013.01); *C23C 16/401* (2013.01); *C23C 16/403* (2013.01); *C23C 16/4488* (2013.01); *C23C 16/455* (2013.01); *C23C 16/54* (2013.01)

(58) Field of Classification Search
   CPC . C23C 16/403; C23C 16/4488; C23C 16/455; C23C 16/46; C23C 16/54; C23C 14/046; C23C 14/564; C23C 14/566; C23C 14/56; H01J 37/32394; H01J 37/32899
   See application file for complete search history.

(56) References Cited

U.S. PATENT DOCUMENTS

| | | | | |
|---|---|---|---|---|
| 5,521,351 A | * | 5/1996 | Mahoney | B23K 10/027 118/723 R |
| 5,565,248 A | * | 10/1996 | Plester | C23C 14/0021 118/50.1 |
| 5,679,412 A | * | 10/1997 | Kuehnle | B29B 13/08 118/723 MW |
| 6,196,154 B1 | * | 3/2001 | Baumecker | C23C 14/56 118/718 |
| 6,223,683 B1 | * | 5/2001 | Plester | B29B 17/0026 118/718 |
| 2003/0232150 A1 | * | 12/2003 | Arnold | B08B 9/426 427/569 |
| 2006/0150909 A1 | * | 7/2006 | Behle | B08B 7/00 118/719 |
| 2010/0096393 A1 | * | 4/2010 | Asahara | B65D 23/02 220/660 |
| 2011/0252899 A1 | * | 10/2011 | Felts | C23C 16/045 73/865.8 |

FOREIGN PATENT DOCUMENTS

| | | | |
|---|---|---|---|
| JP | 2005048272 A | * | 2/2005 |
| JP | 2006 335379 | | 12/2006 |
| JP | 2007 105999 | | 4/2007 |
| JP | 2007105999 A | * | 4/2007 |
| JP | 2008 127054 | | 6/2008 |
| WO | 95/21948 | | 8/1995 |

OTHER PUBLICATIONS

JP2005048272A Ishii et al. English Machine Translation retrieved from Espacenet Aug. 2, 2018 (Year: 2005).*

International Search Report dated Jan. 29, 2013 in PCT/JP12/083679 Filed Dec. 26, 2012.

* cited by examiner

APPARATUS FOR FORMING THIN FILM

TECHNICAL FIELD

The present invention relates to an apparatus for forming thin film (a thin film formation apparatus) that forms a thin film whose gas barrier performance is high, such as a DLC (Diamond Like Carbon) film, an SiOx film, an SiOC film, an SiOCN film, an SiNx film, an AlOx film or the like, upon either the inner surface, or the outer surface, or both, of a container such as a polyethylene terephthalate bottle (a PET bottle) or the like.

BACKGROUND ART

While in the prior art hollow containers made from plastic which are light in weight, such as PET bottles, have been used for storing soft drinks and the like, the use of plastic containers in the food and drink field has spread rapidly due to their convenience and low cost, and, at the present time, PET bottles constitute quite a large proportion of all of the containers. However, with respect to the plastic containers, as compared with the characteristics of metallic cans and glass bottles, as gas barrier performance is lower, ingress of oxygen into the interior of the containers and discharge of carbonic acid gas to the exterior of the containers may well occur, so that, in some cases, the performance for maintaining quality of the contents would be inferior. Due to this, attempts have been made to form upon the inner surface of the container, a film having high gas barrier performance, such as a DLC film or the like. It is possible to form a film whose gas barrier performance is high, such as the DLC film or the like, upon either the inner surface or the outer surface of the container in a vacuum chamber of a vacuum environment according to a plasma CVD method, a metallic vapor deposition method, a heat generating element CVD method, a sputtering method, or the like; and in this case the gas barrier performance against the ingress of oxygen into the interior of the container and the discharge of carbonic acid gas to the exterior of the container can be dramatically improved.

CITATION LIST

Patent Literature

Patent Document 1: Japanese Laid-Open Patent Publication 2008-127054.
Patent Document 2: Japanese Laid-Open Patent Publication 2004-107781.

SUMMARY OF INVENTION

Technical Problem

When a container is mass produced by forming a thin film such as a DLC film or the like upon its surface, the processes are repeated of: performing film formation upon the container in the interior of a vacuum chamber that is maintained in the vacuum state; after having completed film formation, returning the interior of the vacuum chamber to atmospheric pressure and taking out a processed container upon which processing has been completed; and after that, putting the next container into the vacuum chamber, vacuumizing the chamber, and performing film formation. Due to this, when performing vacuumization of the vacuum chamber, it is always necessary to vacuumize the chamber starting from the atmospheric pressure. Therefore, the problem arises that the time period for vacuumizing the vacuum chamber becomes long, and the cycle time becomes slow. In order to attain a shorter cycle time by shortening the time period for vacuumization, it is necessary to provide a large sized vacuum pump, so that there are problems that the facility cost and also its running cost are both increased.

Moreover, with respect to the heat generating element CVD method, which is also known as the hot wire CVD method, the hot filament CVD method, the catalytic chemical vapor deposition method and so on, in the process of forming a thin film upon the surface of the container, a heat generating element is installed within the vacuum chamber because the film formation is performed by putting the heat generating element in the neighborhood of the container. Since the vacuum chamber is returned to the atmospheric pressure after the film formation process has been completed, accordingly the heat generating element is periodically exposed to air. As a result, there are problems that deterioration of the heat generating element due to oxidization and so on takes place progressively, so that its functionality for film formation becomes worse.

The present invention has been conceived in the light of the above considerations, and its object is to provide a thin film formation apparatus that, during formation of a thin film upon the surface of a container, along with making the formation of film thickness distribution simple and easy, and moreover preventing deterioration of the heat generating element, also is able to shorten the time period taken for vacuumization of the interior of a chamber during film formation.

Solution to Problem

In order to attain the object described above, the apparatus for forming film of one aspect of the present invention comprises: a vacuum chamber in which film formation upon a surface of a container is performed in a vacuum state by using a heat generating element; an vacuum evacuation device that vacuumizes the vacuum chamber; and a relative shifting device that, after vacuumization of the vacuum chamber has started, shifts the container and the heat generating element relatively to each other within the vacuum chamber. The heat generating element is a component that the element itself is not substantially vaporized, and that is capable of decomposing a raw material gas into chemical species by a catalytic chemical reaction and/or thermally; this heat generating element may be a wire the main component of whose outer layer is, for example, tantalum, tantalum carbide, tungsten, tungsten carbide, nickel-chrome alloy, or carbon.

According to the present invention, it is possible to perform film formation at any of the following stages: the stage of inserting the heat generating element into the container; the stage of shifting the heat generating element and the container relatively to each other; and the stage of taking out the heat generating element from the container. The insertion and removal need not only be performed once; they may be performed repeatedly. Accordingly, it becomes possible to perform film formation for only a short time period at the locations where time period for film formation should be limited from the point of view of thermal deformation, while with respect to the other locations, film formation is performed sufficiently, and as a result it becomes simple and easy to enhance the barrier performance of the entire container.

In a preferred aspect of the present invention, the relative shifting device may relatively shift the container and the heat generating element at variable speed.

According to this aspect of the present invention, since it is possible to shift the container and the heat generating element relatively to each other at variable speed, it is possible to adjust the time period for film formation upon each portion of the container according to the container shape, the container heat resistance characteristics, and the required performance for the container. Thereby, it becomes simple and easy to adjust the barrier performance and external appearance of the container. Therefore, this is a more desirable aspect of the present invention.

Additionally, in the present invention, the vacuum chamber is divided into a chamber for the container where the container is inserted and taken out, and a chamber for protection of the heat generating element where the heat generating element is held in a vacuum state; and a vacuum isolation device may be provided between the chamber for the container and the chamber for protection.

According to this aspect of the present invention, it is possible always to keep the interior of the chamber for protection in a vacuum state, since the vacuum chamber is divided into: the chamber for inserting the container to perform film formation upon the container; and the chamber for protection for holding the heat generating element in a vacuum state. Due to this, it is possible to prevent deterioration of the heat generating element, and that its functionality for film formation does not decrease. Moreover, at the moment of film formation, vacuumization of the chamber for the container from atmospheric pressure is performed, and when the chamber for the container has reached the predetermined vacuum pressure, then it is possible to lower the vacuum pressure of the chamber for the container by establishing communication thereof with the chamber for protection having a lower vacuum pressure than the chamber for the container. In other words, it is possible to shorten the time period for vacuumization of the chamber for the container and to shorten the cycle time, since the chamber for protection functions as a vacuum buffer.

In a preferred aspect of the present invention, each of the chamber for the container and the chamber for protection may be linked to an individual vacuum evacuation device.

In a preferred aspect of the present invention, the chamber for the container may be vacuumized from atmospheric pressure to be brought to a vacuum state at a moment of film formation upon the container, and be returned to atmospheric pressure after the film formation has been completed.

In a preferred aspect of the present invention, while said chamber for the container is returned to atmospheric pressure after the film formation being completed, the chamber for protection may be kept in a vacuum state.

In a preferred aspect of the present invention, the vacuum isolation device may be opened when the chamber for the container has been vacuumized, so as to communicate together the chamber for the container and the chamber for protection.

The chamber for the container may be provided as a chamber for film formation where the film formation is performed upon the container, due to the relative shifting device which is provided to shift the heat generating element between the chamber for protection and the chamber for the container.

In a preferred aspect of the present invention, the heat generating element may be inserted into the chamber for the container after the vacuum isolation device has been opened, and be returned to the chamber for protection after film formation has been completed.

According to this aspect of the present invention, since the heat generating element is always kept in a vacuum state, accordingly it is possible to prevent deterioration of the heat generating element, and its functionality for film formation does not decrease.

In a preferred aspect of the present invention, after the film formation has been completed and after the heat generating element has been returned to the chamber for protection, the vacuum isolation device may be closed.

In a preferred aspect of the present invention, the chamber for protection may be provided as a chamber for film formation where the film formation is performed upon the container, due to the relative shifting device which is provided to shift the container between said chamber for the container and said chamber for protection. In particular, if a mechanism is provided that is capable of adjusting the shifting speed at which the container is shifted, then it is possible to adjust the time period for film formation upon each of the portions of the container according to the container shape, the container heat resistance characteristics, and the performance required for the container; and it becomes simple and easy to adjust the barrier performance and external appearance of the container. In this way, this is a more desirable aspect of the present invention.

According to this aspect of the present invention, by raising and lowering the container between a container in/out chamber as the chamber for the container and a film deposition dedicated chamber, as the chamber for protection, it is possible to supply the unprocessed container from the container in/out chamber into the film deposition dedicated chamber, and it is also possible to take out the processed container from the film deposition dedicated chamber and transfer it to the container in/out chamber.

In a preferred aspect of the present invention, the container may be inserted into the chamber for protection after the vacuum isolation device has been opened, and is returned to the chamber for the container after the film formation has been completed. After the film formation has been completed and after the container has been returned to the chamber for the container, the vacuum isolation device may be closed.

In a preferred aspect of the present invention, the heat generating element may be inserted into the container when the container has been shifted into the film deposition dedicated chamber. Since, due to this, film formation is performed upon the inner surface of the container, accordingly the thin film is prevented from physical contact imposed from the exterior of the container after the film formation, so that quality management of the container becomes simple and easy.

However, performing the film formation upon the outer surface of the container has the advantage that there is no contact between the film and the contents of the container, and this can be implemented according to other aspects of the present invention. In this case, the film deposition dedicated chamber may be adapted so that the heat generating element is disposed externally to the container. By disposing the heat generating element appropriately, provided are selectable variations which are a case that a film is formed only upon a part of the container outer surface at one time and a case that a film is formed upon the entire outer surface of the container at one time.

In a preferred aspect of the present invention, the container chamber may comprise an open/close gate for taking out and inserting the container from and into the container chamber.

According to this aspect of the present invention, by opening the open/close gate, it is possible to take out the container from the container chamber, or to insert the container into the container chamber. And moreover, after the container chamber is put into an airtight state by closing the open/close gate, it is possible to vacuumize the interior of the container chamber with a vacuum pump.

In a preferred aspect of the present invention, the apparatus for forming thin film may further comprise a container transfer device that transfers an unprocessed container from a predetermined position into the chamber for the container, and that transfers a processed container from the chamber for the container to a predetermined position.

According to this aspect of the present invention, it is possible to transfer the unprocessed container from a predetermined position, for example from the conveyance surface of a conveyer, into the chamber for the container, and moreover it is possible to transfer the processed container from the chamber for the container to a predetermined position, for example, to the conveyance surface of the conveyer.

If the film formation processing is performed upon the container in the chamber for protection with the container in the inverted state, then the container transfer device should include an inversion device. The container transfer device inverts with the inversion device, the unprocessed container at a predetermined position, for example upon the conveyance surface of a conveyer, to put the unprocessed container into an inverted state, and after that, the container transfer device transfers the unprocessed container of the inverted state into the chamber for the container. It should be understood that it would also be acceptable to arrange to invert the container in a waiting position after the container has been transferred. Moreover, the container transfer device transfers the processed container from the chamber for the container to the inversion device, and after that, inverts with the inversion device the processed container to be put into the upright state. Then, the container transfer device returns the processed container in the upright state to a predetermined position, for example upon the conveyance surface of a conveyer.

On the other hand, if the film formation processing is performed upon the container in the chamber for protection with the container in the upright state, then the container transfer device should hold the unprocessed container at a predetermined position, for example upon the conveyance surface of the conveyer to transfer the unprocessed container into the chamber for the container. And, after having taken out the processed container from the chamber for the container, the container transfer device should transfer the processed container to a predetermined position, for example upon the conveyance surface of the conveyer.

In a preferred aspect of the present invention, the predetermined position may be a position upon a conveyer.

In a preferred aspect of the present invention, the volume of a film deposition chamber as the chamber for the container may be smaller than the volume of a heat generating element protection chamber as the chamber for protection.

According to this aspect of the present invention, when the film deposition chamber is vacuumized, it is possible to shorten the time period for the vaccumization.

In a preferred aspect of the present invention, the film deposition chamber may be disposed above, while the heat generating element protection chamber is disposed below.

According to this aspect of the present invention, when the heat generating element is inserted from the heat generating element protection chamber into the interior of the container within the film deposition chamber at a moment of film formation, by putting the container into the inverted state, it is enough to just elevate the heat generating element. Moreover, when the heat generating element is pulled out from the container after film formation and is returned to the heat generating element protection chamber, it is enough to just lower the heat generating element. Accordingly, it is possible to employ a simple mechanism such as an electrically driven rising and lowering cylinder or the like as a drive mechanism for the heat generating element.

In a preferred aspect of the present invention, the capacity of the vacuum pump on the side of the film deposition chamber is smaller than the capacity of the vacuum pump on the side of the heat generating element protection chamber.

According to this aspect of the present invention, it is possible to make the vacuum pump on the film deposition chamber side more compact.

Advantageous Effects of Invention

The present invention provides the advantageous effects listed below.

(1) It becomes possible to perform film formation for only a short time period at the locations where the film formation time period could be limited from the point of view of thermal deformation, while with respect to the other locations it is possible to perform film formation sufficiently. As a result, it becomes simple and easy to enhance the barrier characteristics of the entire container.

(2) It becomes simple and easy to form a film thickness distribution that is appropriate according to the intended purpose of the container and the required appearance quality of the container. Moreover, it becomes possible to implement coloration having graduations or the like.

(3) In the prior art, as a countermeasure to prevent thermal deformation of the container, it was practiced only to start film formation after the heat generating element had been perfectly inserted into the container; but, according to the present invention, it becomes possible to reduce the cycle time, since the film formation can be started from the stage of inserting the heat generating element into the container.

(4) Since it is possible always to keep the heat generating element in the vacuum state, accordingly it is possible to prevent deterioration of the heat generating element, so that the element's functionality for film formation does not decrease.

(5) With respect to only the container chamber, vacuumization and open to atmosphere are implemented repeatedly, while the chamber for protection is always kept in the vacuum state. Due to this, it is only necessary to vacuumize the chamber for the container at a moment of film formation. Therefore it is possible to shorten the time period required during film formation for vacuumizing the entire vacuum chamber, so that it is possible to shorten the cycle time.

(6) When, after having put the container into the chamber for the container, the chamber for the container has been vacuumized from atmospheric pressure and has reached a predetermined vacuum pressure, the communication between the container chamber and the chamber for protection having a lower vacuum pressure than the chamber for the container is established. Thereby, it is possible to lower the vacuum pressure in the chamber for the container. In other words, since the chamber for protection functions as a vacuum buffer, accordingly it is possible to shorten the time period required for vacuumizing the chamber for the container, so that it is possible to shorten the cycle time.

(7) By raising and lowering a plurality of containers between the chamber for the container and the chamber for protection, it is possible to supply this plurality of unprocessed containers from the chamber for the container to the chamber for protection all at the same time and to perform film formation processing upon this plurality of containers simultaneously. Moreover, once they have been processed, it is also possible to take out the plurality of containers processed from the chamber for protection and transfer them to the chamber for the container.

DESCRIPTION OF EMBODIMENTS

In the following, embodiments of the apparatus for forming thin film (the thin film formation apparatus) according to the present invention will be explained with reference to FIGS. 1 through 7. It should be understood that, in FIGS. 1 through 7, the same reference symbols are appended to structural elements that are the same or equivalent, and duplicated explanation will be omitted.

Figure 1:
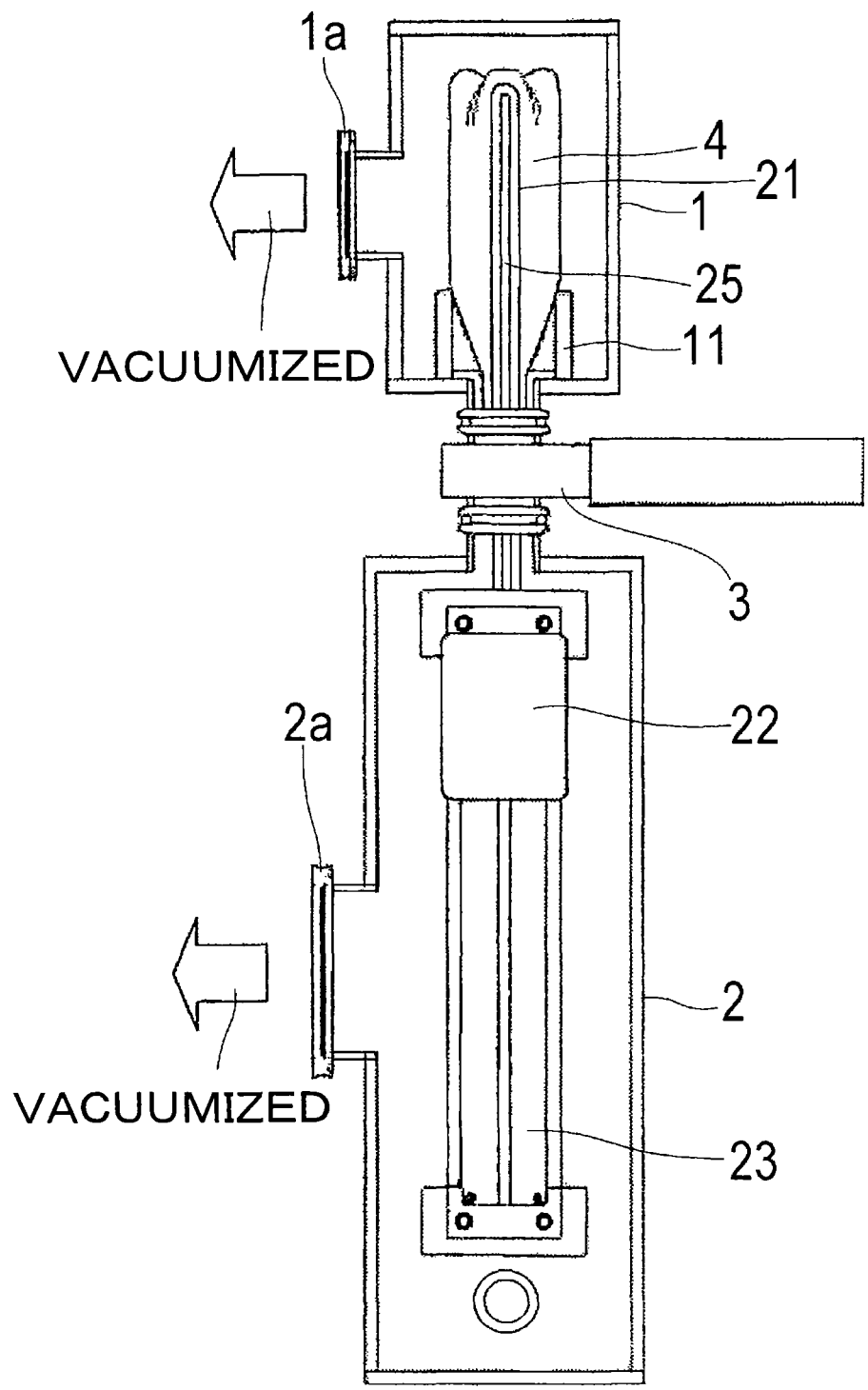
FIG. 1 is a schematic sectional view showing the overall structure of an apparatus for forming thin film (a thin film formation apparatus) according to the present invention.
Figure 2:
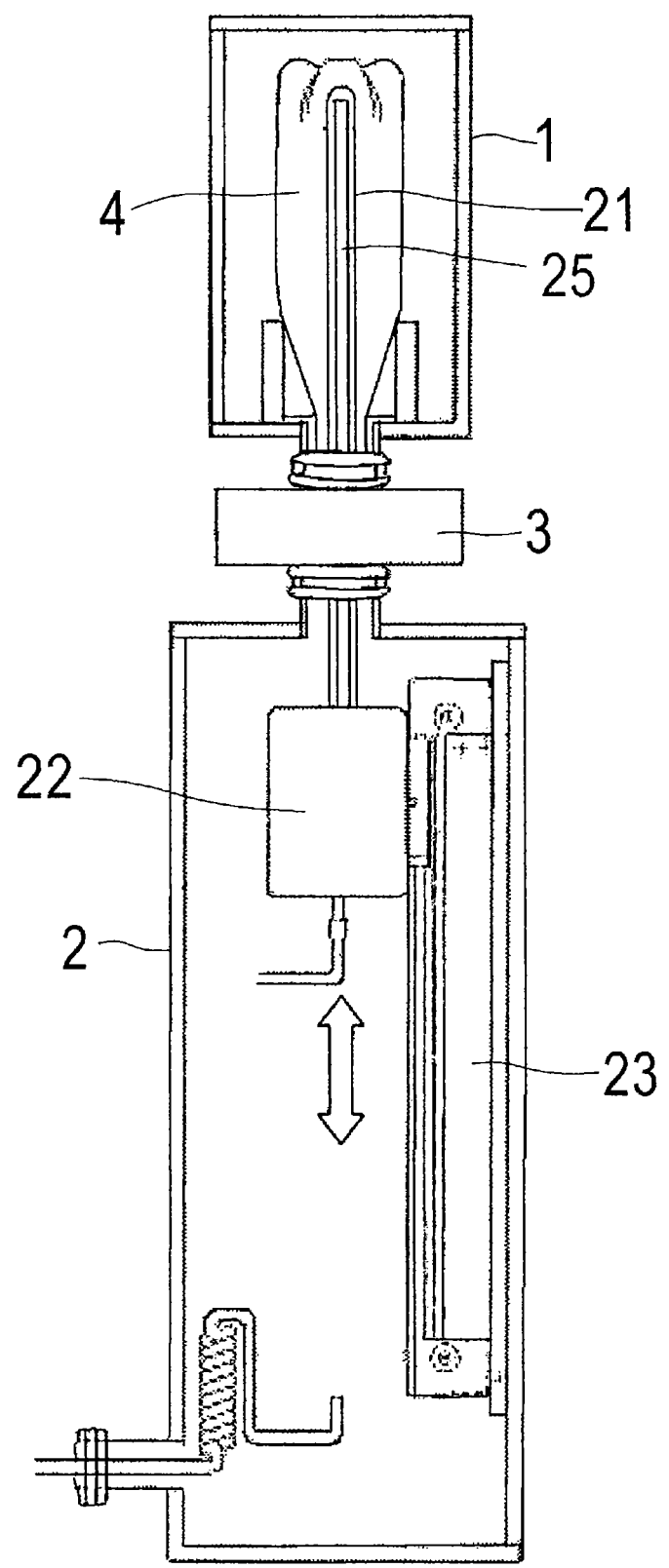
FIG. 2 is a side sectional view of the film formation apparatus shown in FIG. 1.

FIGS. 1 and 2 are figures showing a first embodiment of the thin film formation apparatus according to the present invention.

FIG. 1 is a schematic sectional view showing the overall structure of the thin film formation apparatus according to a first embodiment of the present invention. And FIG. 2 is a side sectional view of the film formation apparatus shown in FIG. 1. As shown in FIGS. 1 and 2, the thin film formation apparatus of the present invention has a structure in which a vacuum chamber is divided into two parts: a film deposition chamber 1, and a heat generating element protection chamber 2. The film deposition chamber 1 is disposed above, while the heat generating element protection chamber 2 is disposed below. The volume of the film deposition chamber 1 is set to be less than the volume of the heat generating element protection chamber 2. The film deposition chamber 1 and the heat generating element protection chamber 2 are linked via a gate valve 3, which serves as a vacuum isolation device. The film deposition chamber 1 is linked via a link portion 1a to a vacuum pump (not shown in the drawings) that serves as a vacuum evacuation device, so that the interior of the film deposition chamber 1 can be vacuumized by this vacuum pump. Moreover, the film deposition chamber 1 comprises a door or shutter (not shown in the drawings) that opens and closes for taking out a PET bottle 4 from the film deposition chamber 1, or for inserting a PET bottle 4 thereinto. A bottle holding portion 11 is installed in the film deposition chamber 1, the bottle holding portion 11 holding the PET bottle 4 in an inverted state.

Moreover, the heat generating element protection chamber 2 is linked via a link portion 2a to a vacuum pump (not shown in the drawings) that serves as a vacuum evacuation device, so that the interior of the heat generating element protection chamber 2 can be vacuumized by this vacuum pump. In this embodiment, each of the film deposition chamber 1 and the heat generating element protection chamber 2 is linked to an individual vacuum pump. The capacity of the vacuum pump on the film deposition chamber 1 side is smaller than the capacity of the vacuum pump on the heat generating element protection chamber 2 side. A heat generating element unit 22 comprising a heat generating element 21 that is electrically connected to a power supply (not shown in the drawings), and an electrically operated cylinder for raising and lowering heat generating element unit 23 that raises and lowers the heat generating element unit 22 are disposed within the heat generating element protection chamber 2. Although this feature is not shown in the figure, it should be understood that a portion of the heat generating element 21 consists of a rod shaped component made from copper that can be inserted into the interior of the PET bottle 4 and removed therefrom, so that heat is not applied substantively when the heat generating element applies heat. The electrically operated cylinder for raising and lowering heat generating element unit 23 is configured so as to vary with a speed controller, the rising/lowering speed of raising or lowering the heat generating element unit 22. This electrically operated cylinder for raising and lowering heat generating element unit 23 constitutes a relative shifting device that shifts the PET bottle 4 and the heat generating element 21 relatively to each other, and relatively shifts the PET bottle 4 and the heat generating element 21 so as to make the portion of the PET bottle 4 upon which a film is to be formed and the heat generating element 21 face each other. It should be understood that, in FIGS. 1 and 2, the heat generating element 21 is shown in its elevated state.

In the film formation apparatus having a structure like that shown in FIGS. 1 and 2, the interior of the heat generating element protection chamber 2 is always kept in a vacuum state, so that the heat generating element 21 existing in the heat generating element protection chamber 2 is always kept in a vacuum state. At this moment, the gate valve 3 is in the closed state, so that communication between the heat generating element protection chamber 2 and the film deposition chamber 1 is intercepted.

After the PET bottle 4 has been put into the film deposition chamber 1 and the PET bottle 4 has been set up on the bottle holding portion 11, the vacuumization of the interior of the film deposition chamber 1 starts. And, when the pressure in the interior of the film deposition chamber 1 has reached a predetermined vacuum pressure which is higher than the vacuum pressure within the heat generating element protection chamber 2, then the gate valve 3 is opened to establish the communication between the film deposition chamber 1 and the heat generating element protection chamber 2. Due to this, the vacuum pressure within the film deposition chamber 1 decreases and becomes equal to the vacuum pressure within the heat generating element protection chamber 2. Accordingly, it is possible to shorten the time period required for vacuumizing the film deposition chamber 1. And electrical power is supplied from a power supply not illustrated to the heat generating element unit 22, so that the heat generating element 21 produces heat. And, by operating the electrically operated cylinder for raising or lowering heat generating element unit 23, the heat generating element unit 22 is raised or lowered at a predetermined speed, so that the heat generating element 21 and the gas supply conduit 25 are inserted into or taken out from the PET bottle 4. In the meantime, the interior of the film deposition chamber 1 reaches a vacuum pressure at which film formation is possible, and, along with supplying raw material gas from the gas supply conduit 25 to the interior of the PET bottle 4, also electrical current is flowed to the heat generating element 21. Due to this, the heat generating element 21 reaches a high temperature, and the heat generating element 21 becomes a heat catalytic element. The raw material gas that is blown out from the gas supply conduit 25 comes into contact with the heat generating element 21 that has become the heat catalytic element, and is decomposed into chemical species by a catalytic chemical reaction and/or thermally. These chemical species reach the inner surface of the PET bottle 4 so as to form a thin film upon the inner surface of the PET bottle 4.

According to the present invention, by providing a structure that makes it possible to adjust the rising and lowering speed at which the heat generating element unit 22 is raised and lowered, it is possible to adjust the time period during which the film is formed over each portion of the container according to the shape of the container, the heat resistance characteristics of the container, and the required performance for the container, and it becomes simple and easy to adjust the barrier performance and external appearance of the container. These features will be explained in detail hereinafter.

When a thin film of a predetermined thickness has been formed on the inner surface of the PET bottle 4, which means that the film formation process has been completed, then the heat generating element unit 22 is lowered, and the heat generating element 21 is returned to the interior of the heat generating element protection chamber 2. Then the gate valve 3 is closed, so that the communication between the film deposition chamber 1 and the heat generating element protection chamber 2 is intercepted. Thereafter, the interior of the film deposition chamber 1 is returned to atmospheric pressure, and, after the processed PET bottle 4 whose processing has been completed has been taken out from the film deposition chamber 1, the next PET bottle 4 is put into the film deposition chamber 1, which is then vacuumized so that the film formation is executed. During the processes described above, the heat generating element 21 is always kept in the vacuum state. Thereafter, the processes described above are repeated.

Next, a second embodiment of the thin film formation apparatus according to the present invention will be explained with reference to FIGS. 3 through 5.

Figure 3:
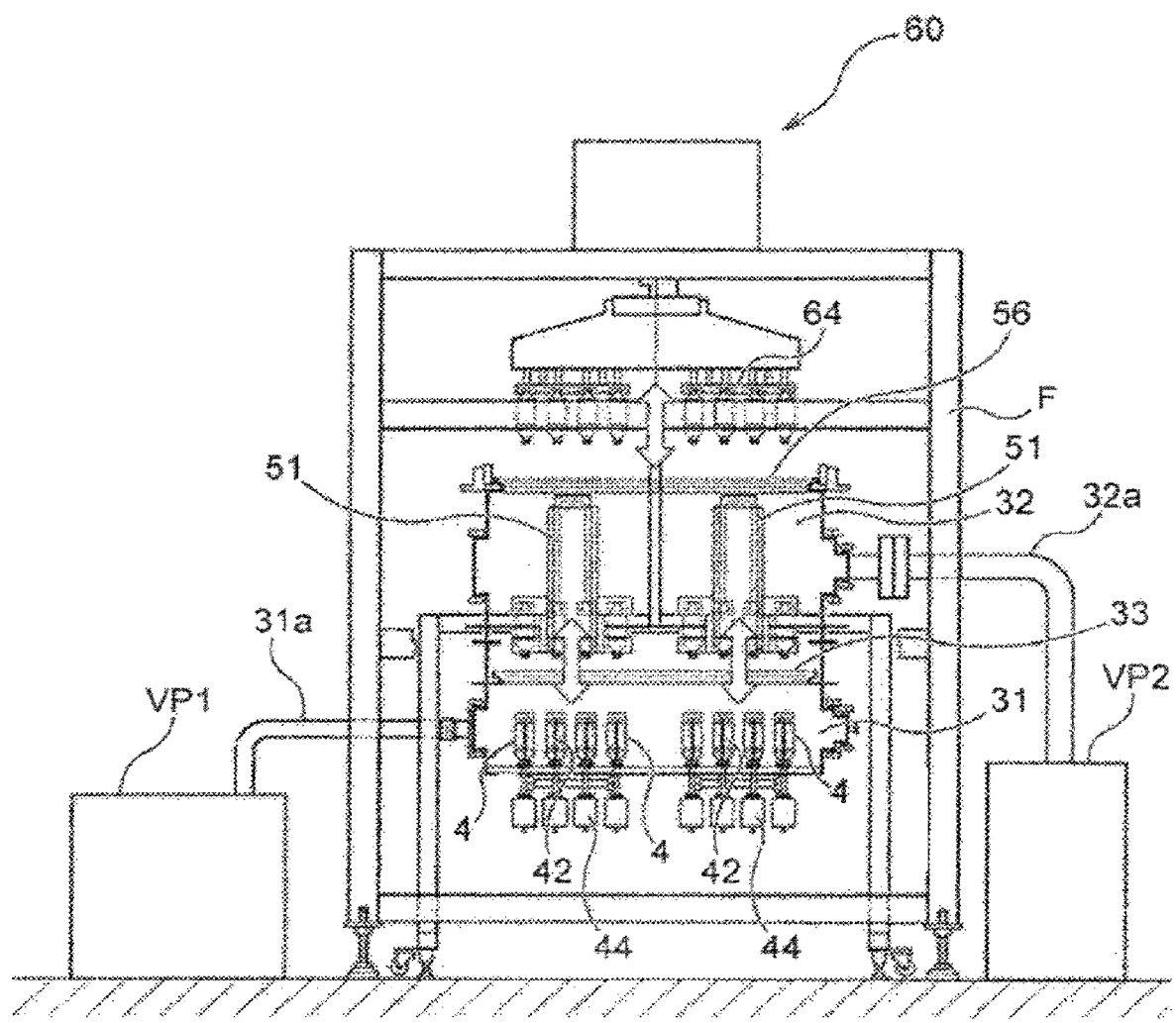
FIG. 3 is a schematic sectional view showing the overall structure of a thin film formation apparatus according to a second embodiment of the present invention.

FIG. 3 is a schematic sectional view showing the overall structure of the thin film formation apparatus according to the second embodiment of the present invention. And FIG. 4 is a side sectional view of the film formation apparatus shown in FIG. 3. As shown in FIGS. 3 and 4, the thin film formation apparatus of the present invention comprises two chambers within a device frame F: a film deposition dedicated chamber 31, and a bottle in/out chamber 32. The film deposition dedicated chamber 31 is disposed below, while the bottle in/out chamber 32 is disposed above. The film deposition dedicated chamber 31 and the bottle in/out chamber 32 are connected via a gate valve 33, which serves as a vacuum isolation device.

The film deposition dedicated chamber 31 is linked via a link portion 31a to a vacuum pump VP1, which serves as a vacuum evacuation device, so that the interior of the film deposition dedicated chamber 31 can be vacuumized by the vacuum pump VP1. A plurality of heat generating element units 44 comprising heat generating elements 42 are disposed within the film deposition dedicated chamber 31. Electrical power is supplied from a power supply not illustrated to the heat generating element units 44, and as a result the heat generating elements 42 are caused to produce heat. Each of the heat generating elements 42 is inserted into one of a plurality of PET bottles 4 being held in the inverted state. In order to heat the heat generating elements 42, an AC or DC power supply can be employed, the power supply providing easily electrical heating, and being cheaper than a combination of a high frequency power supply and an impedance matching device, which would be used in a plasma CVD method. In this embodiment eight heat generating element units 44 are provided, so that it becomes possible to perform film formation processing upon a total of eight PET bottles 4 within the film deposition dedicated chamber 31 at the same time.

Furthermore, the bottle in/out chamber 32 is linked via a link portion 32a to a vacuum pump VP2, which serves as a vacuum evacuation device, so that the interior of the bottle in/out chamber 32 can be vacuumized by the vacuum pump VP2. Two sets of bottle rising/lowering devices 51, each of which raises and lowers a plurality of PET bottles 4 while holding them, are installed within the bottle in/out chamber 32. Each of these bottle rising/lowering devices 51 is configured so as to be capable of raising and lowering four PET bottles 4 while holding them. Thereby, each bottle rising/lowering devices is capable of lowering four PET bottles 4 into the film deposition dedicated chamber 31 while holding them, and also capable of taking out the four PET bottles 4 from the film deposition dedicated chamber 31 and bringing them into the bottle in/out chamber 32. The bottle rising/lowering device 51 is configured to be capable of varying the rising/lowering speed at which the PET bottles 4 are raised or lowered between the film deposition dedicated chamber 31 and the bottle in/out chamber 32. The bottle rising/lowering device 51 constitutes a relative shifting device that makes the PET bottle 4 and the heat generating element 42 shift relatively to each other, so that the bottle rising/lowering device 51 shifts the PET bottles 4 and the heat generating elements 42 relatively so as to make the portion of each PET bottle upon which a film is to be formed face the heat generating element 42 corresponding to the PET element 42. Rising/lowering mechanism portion of each bottle rising/lowering device 51 may be installed at the interior of the chamber, or may be installed at the exterior of the chamber. In a case that the rising/lowering mechanism portion is installed at the exterior of the chamber, only the portion for holding the PET bottles 4 is located at the interior of the chamber, and this portion is raised and lowered by the rising/lowering mechanism portion installed at the exterior of the chamber.

An open/close gate 56 is provided at the upper end of the bottle in/out chamber 32, and, by closing this open/close gate 56, it is possible to put the interior of the bottle supply/remove chamber 32 into an airtight state, so that the bottle supply/remove chamber 32 can be vacuumized by the vacuum pump VP2. And, by opening this open/close gate 56, it is possible to put unprocessed PET bottles 4 into the interior of the bottle in/out chamber 32, or to take out processed PET bottles 4 from the bottle in/out chamber 32.

Next, an inversion device 57 that inverts the PET bottles 4 and a bottle handling device 60 that inserts the inverted PET bottles 4 into the bottle in/out chamber 32 and also takes out the processed PET bottles 4 from the bottle in/out chamber 32 will be explained. The inversion device 57 and the bottle handling device 60 constitute a bottle transfer device.

Figure 4:
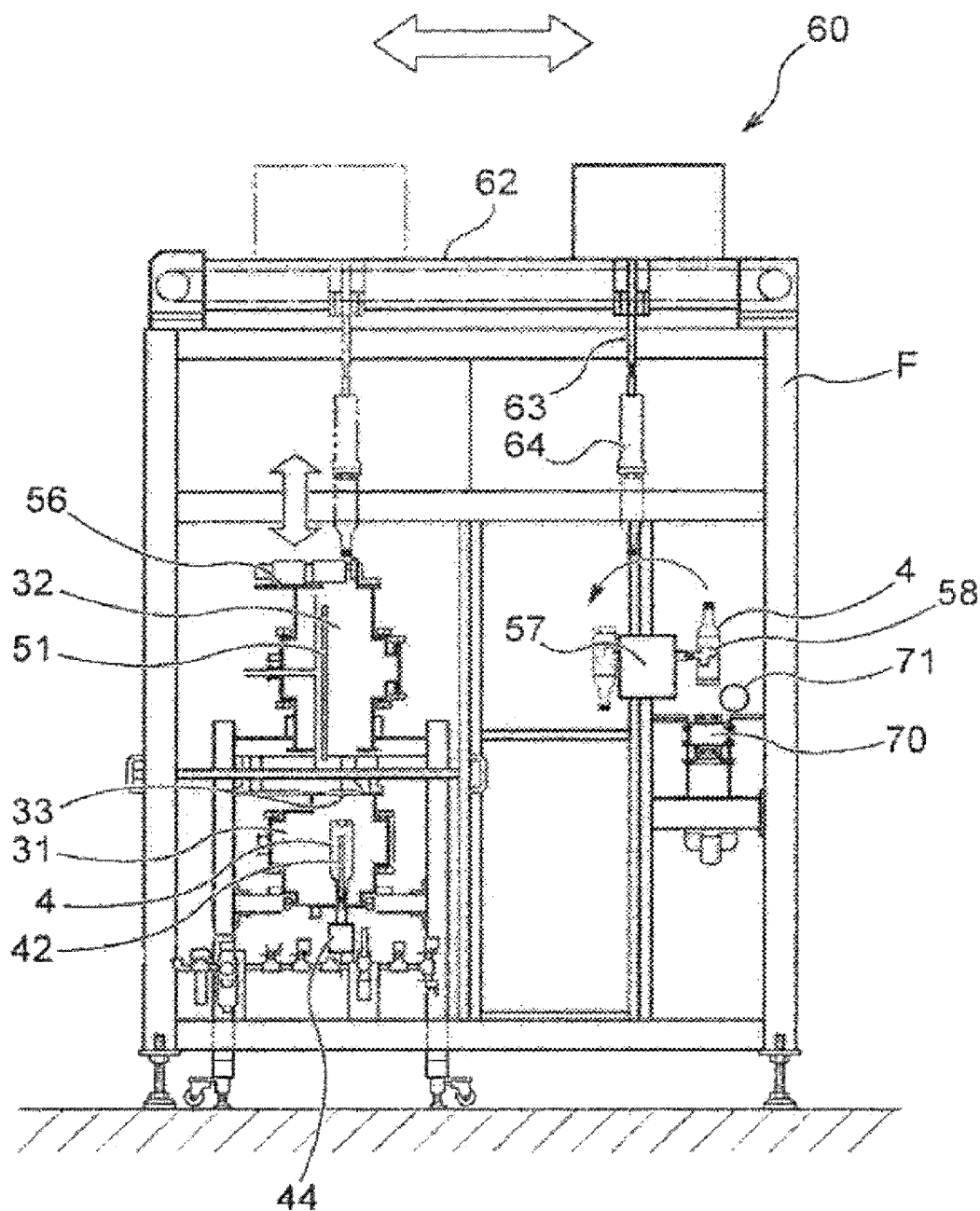
FIG. 4 is a side sectional view of the film formation apparatus shown in FIG. 3.

As shown in FIG. 4, a conveyer 70 that conveys PET bottles 4 in the upright state is installed within the device frame F. A screw 71 for pitch regulation is disposed in parallel with the conveyer 70 for making a space between the PET bottles 4 at a certain regulated pitch, thus defining fixed intervals between the PET bottles 4 upon the conveyer 70. Moreover, the inversion device 57 for inverting the PET bottles 4 is installed in contiguity with the conveyer 70.

The inversion device 57 comprises a plurality of chucks 58 that catch the body portions of the PET bottles 4. The inversion device 7 is configured so as to catch and invert with the plurality of chucks 58, the plurality of PET bottles 4 that have been spaced by the screw 71 at the regulated pitch upon the conveyer 70. Moreover, the inversion device 57 is configured so as to catch and invert the plurality of PET bottles 4 in the inverted state with the plurality of chucks 58, and return the PET bottles 4 in the upright state to the conveyer 70. In this embodiment, the inversion device 57 is made to be capable of inverting eight PET bottles 4 simultaneously.

As shown in FIGS. 3 and 4, the bottle handling device 60 is installed upon the device frame F in a position above the bottle in/out chamber 32 and the conveyer 70. This bottle handling device 60 not only brings the plurality of unprocessed PET bottles 4 into the interior of the bottle in/out chamber 32 in the inverted state, but also takes out from the bottle in/out chamber 32, the plurality of processed PET bottles 4 that are being held in the inverted state within the bottle in/out chamber 32 by the bottle rising/lowering device 51. In this embodiment, the bottle handling device 60 is capable of handling eight PET bottles simultaneously.

The bottle handling device 60 comprises a rising/lowering shaft 63, and a suction head 64 that suctions the bottom portions of the PET bottles 4 is provided at the lower end of the rising/lowering shaft 63. The bottle handling device 60 is configured so as to be reciprocatingly shiftable by a reciprocating shift mechanism 62 between a position above the bottle in/out chamber 32 and a position above the inversion device 57. Accordingly, the bottle handling device 60 can lower the rising/lowering shaft 63 to suction, with the suction head 64, a plurality of unprocessed PET bottles 4 in the inverted state that are at the position of the inversion device 57, and can then raise the rising/lowering shaft 63. After that, the bottle handling device 60 shifts to the position above the bottle in/out chamber 32 by the reciprocating shift mechanism 62. After that, the bottle handling device 60 lowers the rising/lowering shaft 63 to put the plurality of PET bottles 4 into the bottle in/out chamber 32. Moreover, the bottle handling device 60 can lower the rising/lowering shaft 63 to suction, with the suction head 64, a plurality of processed PET bottles 4 in the inverted state that are in the interior of the bottle in/out chamber 32, and can raise the rising/lowering shaft 63. After that, the bottle handling device 60 shifts to the position above the inversion device 57 by the reciprocating shift mechanism 62. After that, the bottle handling device 60 can lower the rising/lowering shaft 63 to return the plurality of PET bottles 4 to the inversion device 57.

In the film formation apparatus having a structure as shown in FIGS. 3 and 4, the interior of the film deposition dedicated chamber 31 is always kept in the vacuum state by the operation of the vacuum pump VP1, so that the heat generating elements 42 existing in the film deposition dedicated chamber 31, are always kept in the vacuum state. At this moment, the gate valve 33 is kept in the closed state, so that the communication between the film deposition dedicated chamber 31 and the bottle in/out chamber 32 is intercepted. The PET bottles 4 being consecutively conveyed in the upright state by the conveyer 70, are spaced by the screw 71 for pitch regulation. Thereby, fixed gaps are made between adjacent ones of these PET bottles 4 at the regulated pitch. The plurality of PET bottles 4 having the fixed gaps of the regulated pitch are inverted by the inversion device 57, so that they come to be in the inverted state. Then the plurality of PET bottles 4, now in the inverted state, are suctioned by the suction head 64 of the bottle handling device 60. At this time, the open/close gate 56 of the bottle in/out chamber 32 is opened. The bottle handling device 60 transfers a plurality of unprocessed PET bottles 4 and puts them into the bottle in/out chamber 32. In this embodiment, it is possible for the bottle handling device 60 to put eight of the PET bottles 4 into the bottle in/out chamber 32 simultaneously. When the plurality of PET bottles 4 put into the interior of the bottle in/out chamber 32 gets held by the bottle rising/lowering device 51, the open/close gate 56 is closed. And, the vacuum pump VP2 is operated to start vacuumization of the interior of the bottle in/out chamber 32 starts.

When due to the operation of the vacuum pump VP2 the vacuum pressure within the bottle in/out chamber 32 reaches a predetermined vacuum pressure, which is still higher than the vacuum pressure of the interior of the film deposition dedicated chamber 31, the gate valve 33 is opened to establish the communication between the film deposition dedicated chamber 31 and the bottle in/out chamber 32. Due to this, the vacuum pressure of the interior of the bottle in/out chamber 32 decreases, and becomes equivalent to the vacuum pressure of the interior of the film deposition dedicated chamber 31. Accordingly, it is possible to shorten the time period required for vacuumization of the bottle in/out chamber 32. Subsequently, the bottle rising/lowering device 51 within the bottle in/out chamber 32 is operated to supply the plurality of unprocessed PET bottles 4 into the interior of the film deposition dedicated chamber 31. These plurality of PET bottles 4 supplied into the interior of the film deposition dedicated chamber 31 are being held by the bottle rising/lowering device 51. The PET bottles 4 are raised and lowered at a speed that has been determined in advance while being held by the bottle rising/lowering device 51. Thereby, the heat generating elements 42 are inserted into, and taken out from, the PET bottles 4 respectively.

Figure 5:
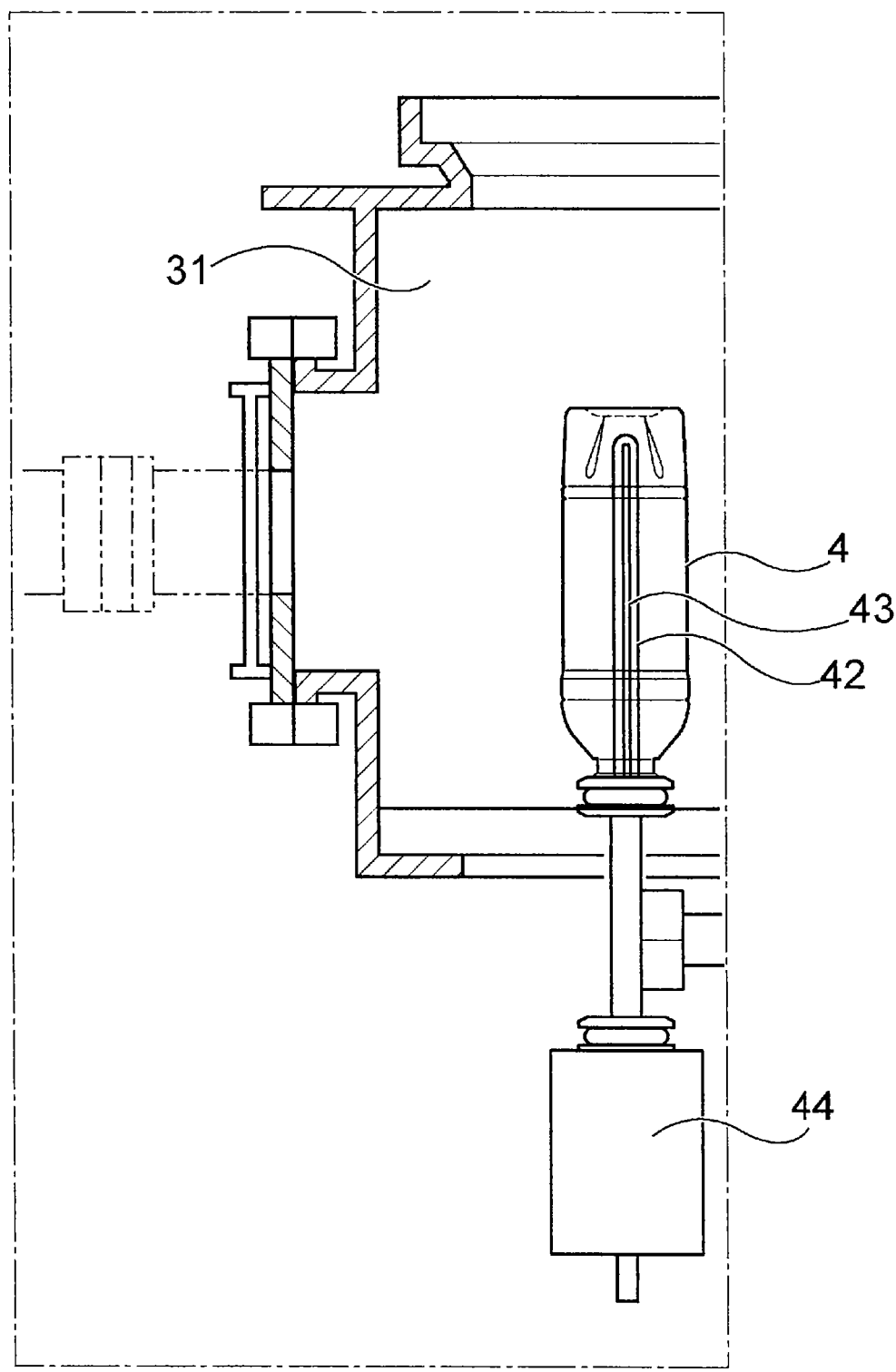
FIG. 5 is a schematic sectional view showing a PET bottle and a line for a heat generating element inserted into that PET bottle.

FIG. 5 is a schematic sectional view showing one of the PET bottles 4 with one of the heat generating elements 42 that has been inserted into the interior of that PET bottle 4. In FIG. 5, the state of the PET bottle 4 is shown in which, due to rising and lowering by the bottle rising/lowering device 51, the heat generating element 42 of the heat generating element unit 44 and a gas supply conduit 43 have been inserted into the PET bottle 4. It should be understood that the bottle rising/lowering device 51 is omitted from this figure. During the above described insertion and taking-out process, the pressure in the interior of the film deposition dedicated chamber 31 reaches a vacuum pressure at which film formation is possible, and, along with raw material gas being supplied to the interior of the PET bottle 4 from the gas supply conduit 43, also electrical current is flowed to the heat generating element 42. Due to this, the heat generating element 42 reaches a high temperature, and the heat generating element becomes a heat catalytic element. The raw material gas blown out from the gas supply conduit 43 comes into contact with the heat generating element 42 that has become the heat catalytic element, and is decomposed into chemical species by a catalytic chemical reaction and/or thermally. These chemical species reach the inner surface of the PET bottle 4, and form a thin film on the inner surface of the PET bottle 4.

According to the present invention, by providing a structure that makes it possible to adjust the rising/lowering speed for raising and lowering the PET bottles 4, it is possible to adjust the time periods for forming films on various portions of a container according to the shape of the container, the heat resistance characteristics of the container, and the required performance for the container; and thereby it becomes simple and easy to adjust the barrier performance and external appearance of the container. This feature of the present invention will be further described later.

After a thin film having a predetermined thickness has been formed upon the inner surfaces of the PET bottles 4, the operation of film formation has been completed. Next, the processed PET bottles 4 have been taken out from the film deposition dedicated chamber 31 by the bottle rising/lowering device 51 to be returned to the bottle in/out chamber 32. After that, the gate valve 33 is closed. Subsequently, a vacuum relief valve (not shown in the drawings) installed to the bottle in/out chamber 32 is operated, so that the interior of the bottle in/out chamber 32 is opened to atmosphere. At this moment, the interior of the film formation dedicated chamber 31 is always kept in the vacuum state, so that the heat generating elements 42 existing in the film deposition dedicated chamber 31, are always held in the vacuum state. And next, the open/close gate 56 is opened, and the PET bottles 4 within the bottle in/out chamber 32 are taken out and are returned to the inversion device 57 by the bottle handling device 60. And the bottle handling device 60 suctions a plurality of new unprocessed PET bottles 4, and brings them into the bottle in/out chamber 32. After these new PET bottles 4 have been brought into the bottle in/out chamber 32, the process for supplying these PET bottles 4 into the film deposition dedicated chamber 31 and the process of film formation upon the PET bottles 4, which have been above mentioned, are repeated.

Although, with the film formation apparatus shown in FIGS. 3 through 5, an example is shown of a case in which film formation processing is performed upon a plurality of PET bottles 4 in the inverted state, it would also be acceptable to arrange to perform film formation processing upon a plurality of PET bottles 4 in the upright state. In this case, a structure would be adopted in which the film deposition dedicated chamber 31 is arranged above while the bottle in/out chamber 32 is arranged below, and in which the heat generating element 42 extends from the top plate portion of the film deposition dedicated chamber 1 downward, and the open/close gate of the bottle in/out chamber 32 is installed at the lower end portion of the bottle in/out chamber 32. The inversion device 57 would be omitted. Moreover, the bottle handling device 60 would be configured so as to hold a plurality of unprocessed PET bottles 4 in the upright state upon the conveyer and to put these PET bottles into the bottle in/out chamber 32, and to hold and return to the conveyer a plurality of processed PET bottles 4 existing in the bottle in/out chamber 32.

As will be clear from the above explanation of the first embodiment and the second embodiment of the present invention, in the present invention, it is arranged to shift the container and the heat generating element relatively to each other after the vacuum chamber has been closed and vacuumization thereof has started, and moreover the relative shifting speed of the container and the heat generating element can be varied. The reasons for this are explained below.

The heat generating element CVD method that is the subject of the present invention has the following characteristics.

(1) The closer the container is to the heat generating element, the higher is the film formation speed, and moreover the greater is the thermal load upon the container. Normally 1 to 10 centimeters is taken as being a suitable distance applicable for film formation at a few Pascals under vacuum conditions.

(2) As a result, when forming a film upon three dimensional container, the film thickness (and the film quality) of the film that is formed at each location upon the three dimensional container, and the thermal load, are determined according to the distance between the heat generating element and the container, and the time period over which heat is applied by the heat generating element.

(3) The film thickness and the film quality determine the barrier performance and the coloration at each location, and the thermal load determines whether or not thermal deformation takes place. If the thermal deformation takes place, generally this three dimensional container will lose its commercial value.

(4) With respect to a three dimensional container, depending upon its intended purpose, as well as preferable barrier performance of the container as a whole, a preferable distribution of film thickness and a preferable distribution of coloration have been known. Moreover, depending upon the shape of the container, there are some locations at which the film formation speed will increase or decrease, and moreover there are some locations at which the thermal load is likely to become greater or smaller.

For the film formation apparatus of the prior art, a method of film formation has been employed in which the positions of the heat generating element and the container are fixed. However, in such method, it is difficult to make adjustments between different locations where to form the film according to the intended purpose of the container and its shape, by varying the distance between the heat generating element and the container.

According to the present invention, by employing a structure in which the film formation is performed while shifting the heat generating element and the three dimensional container relatively to each other, and also by configuring the relative shifting speed means so as to provide variable relative shifting speed, it becomes possible to perform film formation according to the intended purpose of the container and its shape, while minutely adjusting conditions of film formation in a relative manner with respect to different film formation locations. As to this point, the explanation will be described in reference to FIGS. 6 and 7.

Figure 6:
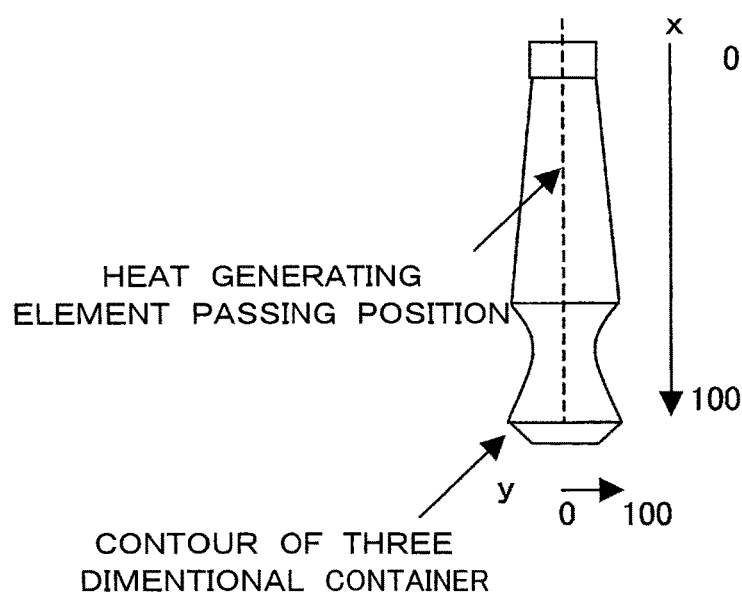
FIG. 6 is a schematic figure showing a container and a heat generating element.
Figure 7:
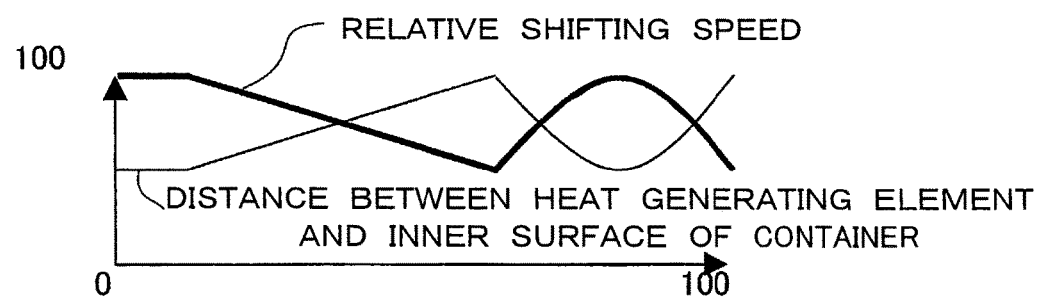
FIG. 7 is a graph showing the relationship between: the distance between the heat generating element and the inner surface of the container; and the relative shifting speed of the heat generating element and the container.

FIG. 6 is a schematic figure showing a container and a heat generating element. And FIG. 7 is a graph showing the relationship between the distance between: the heat generating element and the inner surface of the container; and the relative shifting speed with respect to the heat generating element and the container. To be precise, an example is explained in which the formation speed for forming a thin film of the same substance is proportional to the distance between the heat generating element and the inner surface of the container. The contour of a three dimensional container (shown by a solid line) and a heat generating element passing position along which the heat generating element passes (shown by a dotted line) are shown in FIG. 6. As shown in FIG. 6, when the axial distance along the container from its mouth portion toward its bottom portion is set as the X axis, and the radial direction extending from the axial center of the container to the inner surface of the container is set as the Y axis, the heat generating element passing position coincides with the axial direction of the container (i.e. with the X axis). When plotted is the distance between the heat generating element and the inner surface of the container (the Y axis) to the distance from the mouth portion of the container (x=0) to the bottom portion of the container (x=100), the result is shown by a thin solid line in FIG. 7. As shown in the figure, the distance between the heat generating element and the inner surface of the container varies. And the relative shifting speed with respect to the heat generating element and the container is varied according to the variation of the above mentioned distance, as shown by a thick solid line in FIG. 7. In other words, the relative shifting speed is made fast at locations where the distance between the heat generating element and the inner surface of the container is small, whereas the relative shifting speed is made slow at locations where the distance between the heat generating element and the inner surface of the container is great. The means for implementing this variable speed shifting may, for example be:

1) a servo motor or a stepping motor;
2) an air cylinder equipped with an electromagnetic speed controller; or
3) a mechanical means (a cam and a cam follower) or the like.

By providing a structure such as that described above, it is possible to anticipate advantageous effects such as those described below.

(1) Enhancement of the Barrier Performance (Prevention of Thermal Deformation of the Container)

It becomes possible to perform film formation over only a short time period at locations where time period for film formation should be limited from the point of view of thermal deformation, while with respect to the other locations, it is possible to perform film formation to a sufficient extent, so that, as a result, it becomes simple and easy to enhance the barrier performance of the entire container.

(2) Coloration Adjustment

Formation of a film thickness distribution according to the intended purpose of the container and the required external appearance and quality for the container becomes simple and easy. And moreover it becomes possible to implement coloration having graduations or the like.

(3) Enhancement of the Productivity

Until now, as a countermeasure to prevent thermal deformation of the container, it has been practiced to start film formation after the heat generating element has been perfectly inserted. By contrast, according to the present invention, it becomes possible to reduce the cycle time, since film formation can be started from the stage of inserting the heat generating element into the container.

While various embodiments of the present invention have been explained above, the present invention is not limited to the embodiments described above; of course, it would be possible to implement various other embodiments of the present invention, within the scope of its technical concept.

INDUSTRIAL APPLICABILITY

The present invention can be applied to a film formation apparatus that forms a thin film whose gas barrier performance is high, such as a DLC (Diamond Like Carbon) film, an SiOx film, an SiOC film, an SiOCN film, an SiNx film, an AlOx film, or the like, upon either the inner surface or the outer surface, or both, of a container such as a Polyethylene terephthalate bottle (a PET bottle) or the like.

REFERENCE SIGNS LIST

1: film deposition dedicated chamber
1a: link portion
2: heat generating element protection chamber
2a: link portion
3: gate valve
4: PET bottle
11: bottle holding portion
21: heat generating element
22: heat generating element unit
23: electrically operated cylinder for raising and lowering heat generating element unit
25: gas supply conduit
31: film deposition dedicated chamber
31a, 32a: link portions
32: bottle in/out chamber
33: gate valve
42 heat generating element
43: gas supply conduit
44: heat generating element unit
51: bottle raising/lowering device
56: open/close gate
57: inversion device
58: chuck
60: bottle handling device
62: reciprocating shift mechanism
63: rising/lowering shaft
64: suction head
70: conveyer
71: screw
F: device frame
VP1, VP2: vacuum pumps

The invention claimed is:
1. An apparatus for forming a film on a surface of a container, the apparatus comprising:
a vacuum chamber comprising a first chamber, a second chamber, and a gate valve placed between the first chamber and the second chamber;
a gas supply conduit configured to introduce material gas into the vacuum chamber;
a heat generator contained in the second chamber of the vacuum chamber and configured to generate heat such that a temperature of the heat generator is increased and that the heat generator serves as a heat catalytic element to form the film from the material gas; and a rising/lowering device comprising an electrically operated cylinder configured to move the heat generator between the first chamber and the second chamber such that the heat generator is inserted into an inside of the container in the first chamber,
wherein the first chamber is configured such that the container is inserted into and taken out from the first chamber and that the film is formed on the surface of the container in the first chamber.

2. The apparatus according to claim 1, wherein the rising/lowering device is configured to move the heat generator such that the heat generator is inserted into the first chamber after the gate valve is opened, and is returned to the second chamber after the film is formed on the surface of the container.

3. The apparatus according to claim 2, wherein the gate valve is configured to be closed after the heat generator is returned to the second chamber.

4. The apparatus according to claim 1, wherein the first chamber comprises an open/close gate for taking out and inserting the container from and into the first chamber.

5. A method of forming a film on a surface of a container with the apparatus of claim 1, the method comprising:
   inserting the container into the first chamber while the gate valve is closed and the heat generator is held in the vacuum state in the second chamber;
   vacuumizing the first chamber;
   opening the gate valve when the first chamber is vacuumized to the predetermined vacuum pressure so that the first chamber communicates with the second chamber;
   and moving the heat generator by the rising/lowering device such that the heat generator is inserted into the inside of the container after the gate valve is opened; and
   flowing electrical current to the heat generator and introducing the material gas through the gas supply conduit to form the film on the surface of the container.

6. The method according to claim 5, further comprising:
   closing the gate valve after the film is formed on the surface of the container; and
   taking the container having the film out of the first chamber while the gate valve is closed and the heat generator is held in the vacuum state in the second chamber.

7. The method according to claim 6, wherein the inserting of the container, the vacuumizing of the first chamber, the opening of the gate valve, the moving of the heat generator, the flowing of the electrical current and introducing of the material gas, the closing of the gate valve, and the taking out of the container are sequentially repeated for a plurality of times.

8. The apparatus according to claim 1, further comprising: a speed controller configured to control the rising/lowering device such that a speed for moving the heat generator is determined based on a distance between the heat generator and the surface of the container.

9. The apparatus according to claim 1, further comprising:
   a first vacuum pump connected to the first chamber; and
   a second vacuum pump connected to the second chamber,
   wherein the first vacuum pump has a capacity smaller than a capacity of the second vacuum pump.

10. The apparatus according to claim 1, wherein the material gas comprises a material to form the film, which comprises at least one selected from the group consisting of a diamond like carbon, $SiO_x$, SiOC, SiOCN, $SiN_x$, and $AlO_x$.

11. The apparatus according to claim 1, wherein the heat generator comprises a wire comprising at least one selected from the group consisting of tantalum, tantalum carbide, tungsten, tungsten carbide, nickel-chrome alloy, and carbon.

12. The apparatus according to claim 1, wherein the rising/lowering device is configured to move the heat generator and the gas supply conduit, such that the heat generator and the gas supply conduit are inserted into the inside of the container.

13. The apparatus according to claim 1, wherein the gate valve is capable of separating the first chamber and the second chamber such that only the second chamber is vacuumized when the apparatus is not in the state of film formation.

* * * * *